United States Patent
Beier et al.

(10) Patent No.: US 6,765,604 B2
(45) Date of Patent: Jul. 20, 2004

(54) BANDING-REDUCED IMAGING OF A PRINTING FORM

(75) Inventors: Bernard Beier, Ladenburg (DE); Uwe Ernst, Mannheim (DE); Bernd Vosseler, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 43 days.

(21) Appl. No.: 10/066,105

(22) Filed: Feb. 1, 2002

(65) Prior Publication Data

US 2002/0154207 A1 Oct. 24, 2002

(30) Foreign Application Priority Data

Feb. 22, 2001 (DE) .......................................... 101 08 624

(51) Int. Cl.[7] .............................. B41J 2/455; B41J 2/435
(52) U.S. Cl. ........................ 347/233; 347/234; 347/248
(58) Field of Search ................................. 347/129, 130, 347/233, 234, 238, 248, 200; 359/198; 358/1.9

(56) References Cited

U.S. PATENT DOCUMENTS

| | | | |
|---|---|---|---|
| 4,900,130 A | * 2/1990 | Haas ........................... | 359/198 |
| 5,450,099 A | 9/1995 | Stephenson et al. ........ | 347/200 |
| 5,521,748 A | 5/1996 | Sarraf .......................... | 359/321 |
| 5,691,759 A | 11/1997 | Hanson ....................... | 347/233 |
| 5,757,411 A | 5/1998 | Florence ..................... | 347/245 |
| 5,818,498 A | 10/1998 | Richardson et al. ........ | 347/237 |
| 5,942,745 A | 8/1999 | Kline et al. ............... | 250/208.1 |
| 6,181,362 B1 | * 1/2001 | Laberge ...................... | 347/233 |
| 6,252,622 B1 | 6/2001 | Laberge ...................... | 347/238 |
| 6,563,601 B1 | * 5/2003 | Yamada et al. .............. | 358/1.9 |

FOREIGN PATENT DOCUMENTS

| | | |
|---|---|---|
| EP | 0878773 | 11/1998 |
| EP | 0947950 | 10/1999 |

* cited by examiner

*Primary Examiner*—Hai Pham
(74) *Attorney, Agent, or Firm*—Davidson, Davidson & Kappel, LLC

(57) ABSTRACT

A method and a device for imaging a printing form (48) via at least two imaging modules (40,418) which each have at least one light source are disclosed for avoiding the banding effect that an imaging in a transition region (416). The two imaging modules (40,418) are provided in such a manner that a number of at least partially not-simply connected printing dots are produced in the transition region (416) by the first imaging module (40) and the complementary, not-simply connected printing dots are produced in the transition region (416) by the second imaging module (418).

7 Claims, 5 Drawing Sheets

BANDING-REDUCED IMAGING OF A PRINTING FORM

Figure 1:
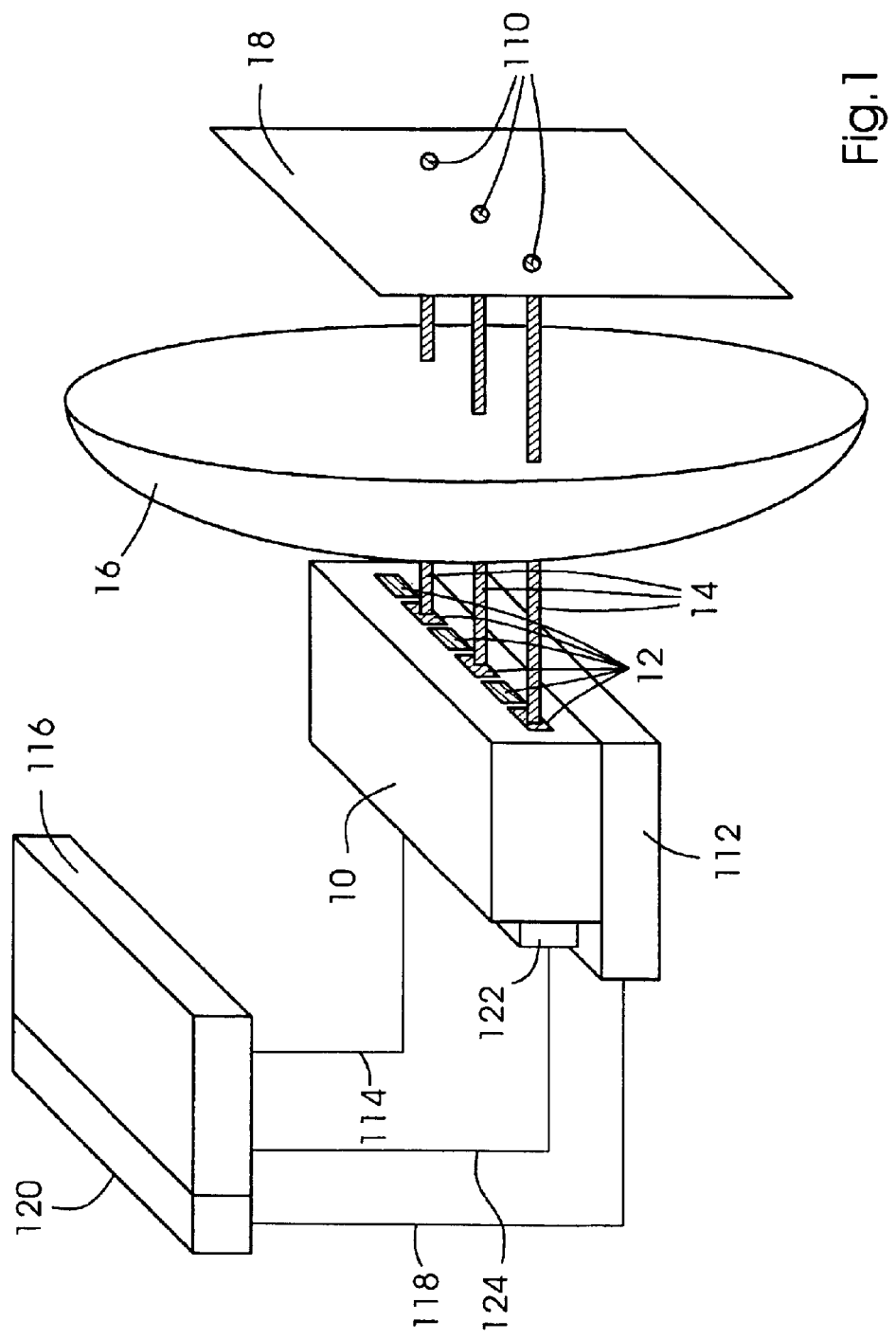

Priority to German Application No. 101 08 624.5, filed Feb. 22, 2001 and hereby incorporated by reference herein, is hereby claimed.

BACKGROUND INFORMATION

The present invention generally relates to image-forming methods for use in the graphics technology, in particular, in the printing technology or duplicating technology. In particular, it relates to a method and a device for imaging a printing form via at least two imaging modules according to the respective generic parts of the independent claims.

In the field of graphics technology, in particular, of offset printing technology, it is known in the production of plane or curved printing forms through so-called "multibeam imaging" to use imaging modules, with which a plurality of imaging spots are simultaneously imaged on different media such as printing plates, films, data carriers, or the like.

At the moment, for imaging printing plates through light sources, one uses primarily laser diode systems which are based on two different concepts. On the one hand, the radiation of individual laser diodes or of an array of laser diodes can be guided to the medium to be imaged via optical elements such as lenses, mirrors or fibers. On the other hand, it is possible for the radiation from a laser light source, typically laser diode bars, to be imaged via diverse optical elements onto an array of n modulators, with n being a natural number, typically electro-optical or acousto-optical modulators. In this context, the individual control of the n modulators permits the selection of individual beams from the entire radiation and the modulation of the power thereof. Such laser diode systems are revealed, for example, by European Patent Application No. 0 878 773 A2 and U.S. Pat. No. 5,521,748.

Furthermore, so-called "interleaving raster scan line methods" (hereinafter referred to as "IRS methods") are known in which raster scan lines are written onto a medium using a multibeam laser light source.

Thus, U.S. Pat. No. 5,691,759 reveals a method of that kind in which a laser light source generates n imaging spots, with n being a natural number, with modulated power via corresponding imaging optics and intensity modulation. These n imaging spots are arranged on one line, in other words, they lie in one row. Subsequent to imaging n dots, a shifting of the medium relative to the imaging spots is carried out with a translation component perpendicular to the direction defined by the axis of the imaging spots so than n dots can be written at another location of the medium again. Typically, the axis of the imaging spots runs essentially parallel to the axis of a cylinder on which a printing form to be imaged is accommodated. Because of the laser radiation whose power is modulated in accordance with the respective image information, the mentioned raster scan lines of intensity-modulated imaging spots are formed. In this manner, an individual blackening of different printing dots can be attained.

At this point, it should already be pointed out that, in the one-dimensional case, a "line of printing dots" will be understood in this context as a line which results from a subsequent displacement of the imaging module having a number of light sources or, alternatively, of the medium to be written on, that is, of the printing form, in the direction defined by the row of imaging spots of the imaging module. Accordingly, a line denotes printing dots, which lie at the same height, of different scan lines written side by side. IRS methods can be easily generalized to the two-dimensional case with imaging spots forming an evenly spaced ($n_1 \times n_2$) matrix, with $n_1$, and $n_2$ being natural numbers, by carrying out an IRS method in the direction defined by a line of the matrix as well as an IRS method in the direction defined by a column of the matrix.

According to U.S. Pat. No. 5,691,759, upon completion of a scan with a translatory component in a perpendicular direction, a displacement by a distance is carried out parallel to the direction defined by the axis of the n imaging spots. The n imaging spots are now displaced again on the surface of the medium with a translatory component perpendicular to the direction defined by the axis of the imaging spots so that further scan lines are formed. Thus, each raster scan line is spatially separated from its immediate neighbor by the spacing of the printing dots. Using a plurality of optical beams of a laser light source in this manner, an overlapping (interleave) of the scan lines is attained accordingly.

Furthermore, European Patent Application No. 0 947 950 A2 discloses an enhanced IRS method in which an overlapping is attained, i.e., new scan lines are written between previously written scan lines, without any location being multiply touched by an imaging spot of the laser, given a suitable selection of the step size of the displacement parallel to the axis defined by the imaging spots by which step size the medium is moved between the writing of two scan lines.

In addition, commonly-assigned German Patent Application No. 100 31 915 and related U.S. patent application Ser. No. 09/879,609 (which are not necessarily prior art and are herein incorporated by reference), describe an IRS method in which, for imaging printing plates via an imaging module, a printing form is imaged in separated raster scan lines. Via a projection optics, n imaging spots are generated which have a distance l between neighboring spots. An interleaf method is used which has the feature that the step size of the displacement in the direction of the axis defined by the imaging spots is larger than spacing l of neighboring spots.

When using a plurality of imaging modules in parallel, it is possible to image separate regions of the entire area to be imaged via an allocated imaging module, respectively, to attain a faster imaging of a printing form. To this end, the surface to be imaged is typically divided into strips. In the process, each of the strips is imaged by a separate imaging module. In the region in which in each case two such strips meet, adjustment errors of the two imaging modules that are imaging relative to each other become especially visible because of the sharp edge between the two strips, in particular in connection with the high precision requirements in the graphics technology. If, for instance, the two imaging modules are arranged slightly too far apart, a gap will results; otherwise, too broad a line will form. In literature, this effect is known as "banding".

To reduce the aforementioned banding effect, U.S. Pat. No. 5,942,745 discloses a design approach in which the sharp edge is substituted by a frayed edge. This frayed edge is produced within a transition region between tow adjacent regions in that continuous lines of printing dots are generated in this transition region in each case within a first section from the boundary with the first adjacent region up to an intermediate dot by the imaging module assigned to the first region and, within a second section from the intermediate dot up to the boundary with the second region by the imaging module assigned to the section region, it being possible for the position of the intermediate dots to be different for neighboring lines, that is, lines of different height in a direction parallel to the region boundaries.

Moreover, U.S. Pat. No. 5,818,498 and U.S. Pat. No. 5,757,411 describe design approaches in which pixels in the edge region between two adjacent regions are imaged at least twice.

The two aforementioned procedures, that is, the generation of a frayed edge as well as the multiple imaging in a transition region, have the disadvantage that the strip width to be imaged by an imaging module is additionally increased considerably, either to be able to place printing dots at different locations up to intermediate dots or to be able to carry out multiple imaging of individual printing dots. Because of this, the goal of attaining a faster imaging by dividing the printing form into different regions which are each imaged by separate imaging modules can be frustrated. It is even possible that several imaging modules are required for imaging the enlarged strip width.

SUMMARY OF THE INVENTION

An object of the present invention is to provide a method and a device for imaging a printing form mentioned at the outset which avoid the aforementioned disadvantages of the related art and reduce the banding effect in an uncomplicated technical manner and therefore at low cost.

The present invention provides a method for imaging a printing form (48) via at least one first imaging module (40) and one second imaging module (418) for producing printing dots on the printing form (48), in connection with which both imaging modules (40, 418), for the imaging in a transition region (416), cover identical locations of the printing form (48). In transition region (416), a number of at least partially not-simply connected printing dots are produced by the first imaging module (40) and the complementary, not-simply connected printing dots are produced by the second imaging module (418).

The present invention also provides a device for imaging a printing form (48) via at least two imaging modules (40, 418) which are movable relative to the printing form (48), the movement of the first imaging module (40) guiding the imaging spots of at least one light source (410) and the movement of the second imaging module (418) guiding the imaging spots of at least one light source (422) over a transition region (416) of the printing form, so that printing dots are produced by a single passage of an imaging spot (410, 422) of a light source. The imaging spots (410) of the light sources of the first imaging module (40) produce a set of printing dots in the transition region (416) constituting a not-simply connected set, and the imaging spots (422) of the light sources of the second imaging module (418) produce the complementary, not-simply connected set of printing dots in the transition region (416).

The present invention is based on the idea of reducing or even completely suppressing the banding effect by a special application or utilization of the above-described IRS method and by providing an appertaining device. When imaging using an IRS method, in each case at the beginning and at the end of the process of writing a continuous line of printing dots, that is, of imaging spots, or of printing dots generated by multiple imaging, a region is formed in which only a part of the printing dots to be placed are imaged on the printing form. In the following, these regions will also be referred to as starting border and end border. In a continuous line, printing dots to be imaged typically lie at a distance p of neighboring dots, in other words: dots at distance p are lying close together. Imaged, thus placed and non-imaged, thus non-placed printing dots lie now in the starting border and end border. In this context, the imaged or placed printing dots constitute a set of dots having a not-simply connected topology. In this context, this means that the set of placed printing dots includes at least one dot having at least one immediately neighboring dot which is not placed. Accordingly, the non-placed printing dots in the starting edge and in the end edge constitute complementary sets, respectively. The set of placed printing dots united with the complementary set includes all printing dots in the starting edge and in the end edge, respectively. Then, the dots of the union of sets lie close.

The method according to the present invention for imaging a printing form via at least one first imaging module and one second imaging module for producing printing dots on the printing form, both imaging modules covering identical locations of the printing form for the imaging in a transition region, has the feature that, in the transition region, a number of at least partially not-simply connected printing dots are produced by the first imaging module and the complementary, not-simply connected printing dots are produced by the second imaging module.

In this context, in an advantageous embodiment, the method according to the present invention for imaging a printing form via at least two imaging modules, in the general case m imaging modules with m being a natural number, which each have at least one, preferably a number of light sources, for producing printing dots on the printing form, typically at intervals p of two neighboring printing dots, includes the following steps: The printing form is divided into m, preferably simply-connected, strip-shaped regions having (m−1) transition regions, each of the m regions being assigned an imaging module and each of the (m−1) transition regions being assigned the two imaging modules of the two adjacent regions. Using a suitable actuating mechanism, via a servomotor or the like, a relative motion is generated between the imaging modules and the printing form in such a manner that the locations of the printing dots to be produced are covered at least once by an imaging spot of a light source in an imaging module. The mentioned division of the printing form can be determined, for example, by the amplitudes of the movement of the imaging modules without concretely defining regions on the printing form. Thus, an imaging of the printing form is carried out in each of the m regions by the imaging module assigned thereto via preferably linearly arranged imaging spots of the light source of the imaging module, and an imaging of the printing form is carried out in each of the (m−1) transition regions by two imaging modules of the two adjacent regions via preferably linearly arranged imaging spots of the light sources of the imaging modules. The method according to the present invention for imaging a printing form has the feature that at least in one transition region, a number of at least partially not-simply connected printing dots are produced by the imaging module of the first adjacent region and in that complementary, not-simply connected printing dots are produced by the imaging module of the second adjacent region.

It is particularly advantageous for the use of the method according to the present invention to divide the printing form into m similar simply connected regions and (m−1) similar transition regions featuring an equivalent geometry. In this context, similar regions or similar transition regions having an equivalent geometry means that the simply connected regions have the same number of printing dots and an equivalent distribution in the coordinate directions defining the printing form. Similar transition regions having an equivalent geometry means that these likewise have the same number of printing dots with a corresponding distribution in the two coordinate directions defining the surface of the printing form.

It is particularly advantageous to use imaging modules which have n light sources with n being from the natural numbers, and whose imaging spots on the printing form have a distance l between neighboring imaging points, with l being a multiple of spacing p of two neighboring printing dots. It is advantageous for the printing form to be imaged by each imaging module in the region assigned thereto and in the transition region or transition regions assigned thereto, using an interleaf method. In such an interleaf method, it applies preferably that translation distance t and spacing l of neighboring imaging spots, both measured in units of the spacing of neighboring printing dots p, are relatively prime, natural numbers. In this context, it is preferred to use an interleaf method having a step size by translation distance t which is equal to the number n of the light sources in each of the m imaging modules. In this connection, the step size by translation distance t is larger than spacing l of neighboring imaging dots.

The device according to the present invention provdes for imaging a printing form via at least two imaging modules which are movable relative to the printing form. The movement of the first imaging module guides the imaging spots of at least one light source and the movement of the second imaging module guides the imaging spots of at least one light source over a transition region of the printing form so that printing dots are produced by a single passage of an imaging spot of a light source. The device has the feature that the imaging spots of the light sources of the first imaging module produce a set of printing dots in the transition region which form a not-simply connected set, and that the imaging spots of the light sources of the second imaging module produce the complementary, not-simply connected set of printing dots in the transition region.

In advantageous embodiment, the device according to the present invention for imaging a printing form features at least two imaging modules which are movable relative to the printing form and each contain at least one light source, preferably a number of separate light sources. The movement of the first imaging module guides the imaging spots of the light sources of the first imaging module over a first region and a transition region of the printing form, and the movement of the second imaging module guides the imaging spots of the light sources of the second imaging module over a second region and the transition region of the printing form. Printing dots are placed by the first imaging module in the first region and in the transition region and by the second imaging module in the second region and in the transition region in such a manner that a printing dot can be produced by a single passage of an imaging spot of a light source. It is a feature of the device according to the present invention that the imaging spots of the light sources of the first imaging module produce a set of printing dots in the transition region which form a not-simply connected set, and that the imaging spots of the light sources of the second imaging module produce the complementary, not-simply connected set of printing dots in the transition region. A generalization to m regions and (m−1) transition regions is obvious to one skilled in the art.

It is especially advantageous if each imaging module features n light sources lying essentially on a line at a distance l between neighboring light sources.

In other words, according to the present invention, preferably using an IRS writing method, in two adjacent regions which are imaged by light sources in a first or light sources in a second imaging module, or at lines in the transition region, a pattern of placed printing dots is produced by the first imaging module which is disjunct to the pattern of printing dots placed by the second imaging module, the patterns having a not-simply connected topology.

In particular, the present invention proposes for the amount of relative movement between the imaging modules and the printing form in the direction defined by the axis of the light sources to be selected greater than spacing l of neighboring imaging spots of the n light sources in each imaging module and, in combination therewith, that the amount of said relative movement be selected such that at two meeting lines in the transition region between a first region which is assigned a first imaging module and a second region which is assigned a second imaging module, the set of printing dots placed in the transition region by the first imaging module is complementary to the set of printing dots placed in the transition region by the second imaging module and, therefore, that the printing dots placed altogether lie close. In other words: The overlapping of the starting border of the line placed by the second imaging module and of the end border of the line placed by the first imaging module results in a closed interleaving of the printing dots in the transition region.

It is worth mentioning that a continuous writing during which each printing dot is written exactly once can be achieved in particular if number n of the imaging spots and spacing l thereof, measured in units of spacing p of the printing dots, do not have a common divisor that is if they are relatively prime.

A closed interleaving of the imaging spots is made possible by overlapping the end border of the line placed by the imaging module of the first region and the starting border of the line placed by the imaging module of the second region.

In this manner, first of all, a sharp edge between the strip shaped regions is dissolved and the banding offset is distributed over a larger image area, thus being reduced for the eye of an observer. Therefore, the present invention enables the banding effect to be reduced in a particularly advantageous manner, however, without at the same increasing the time needed for an imaging process.

It deserves special mention that the method and the device according to the present invention for imaging a printing form, in addition to the above described application in the field of laser-based imaging of printing forms, can also be correspondingly used in an advantageous manner in the field of related printing or duplicating methods, for example, in the field of the printing techniques of laser printing, ink jet printing, or that based on the principle of spark discharge as well as in the field of copying techniques based on the Xerox method or on similar methods, or the like. Because when working with these techniques, imaging media are also imaged in the form of lines using discrete imaging sources and, consequently, the above described banding effect occurs there as well, resulting in the side effects mentioned which affect the quality of the print image.

DETAILED DESCRIPTION OF THE DRAWINGS

Figure 2:
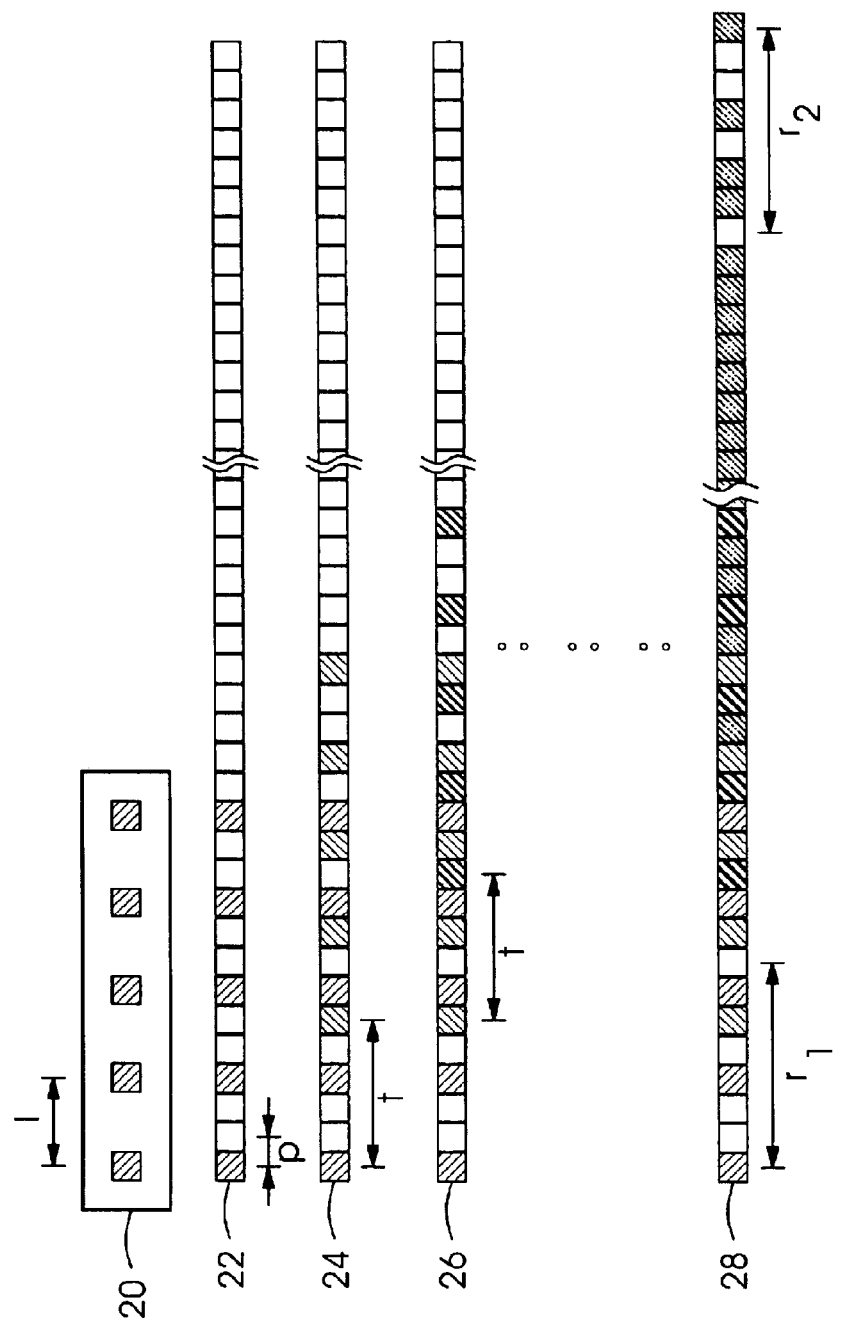
Figure 3:
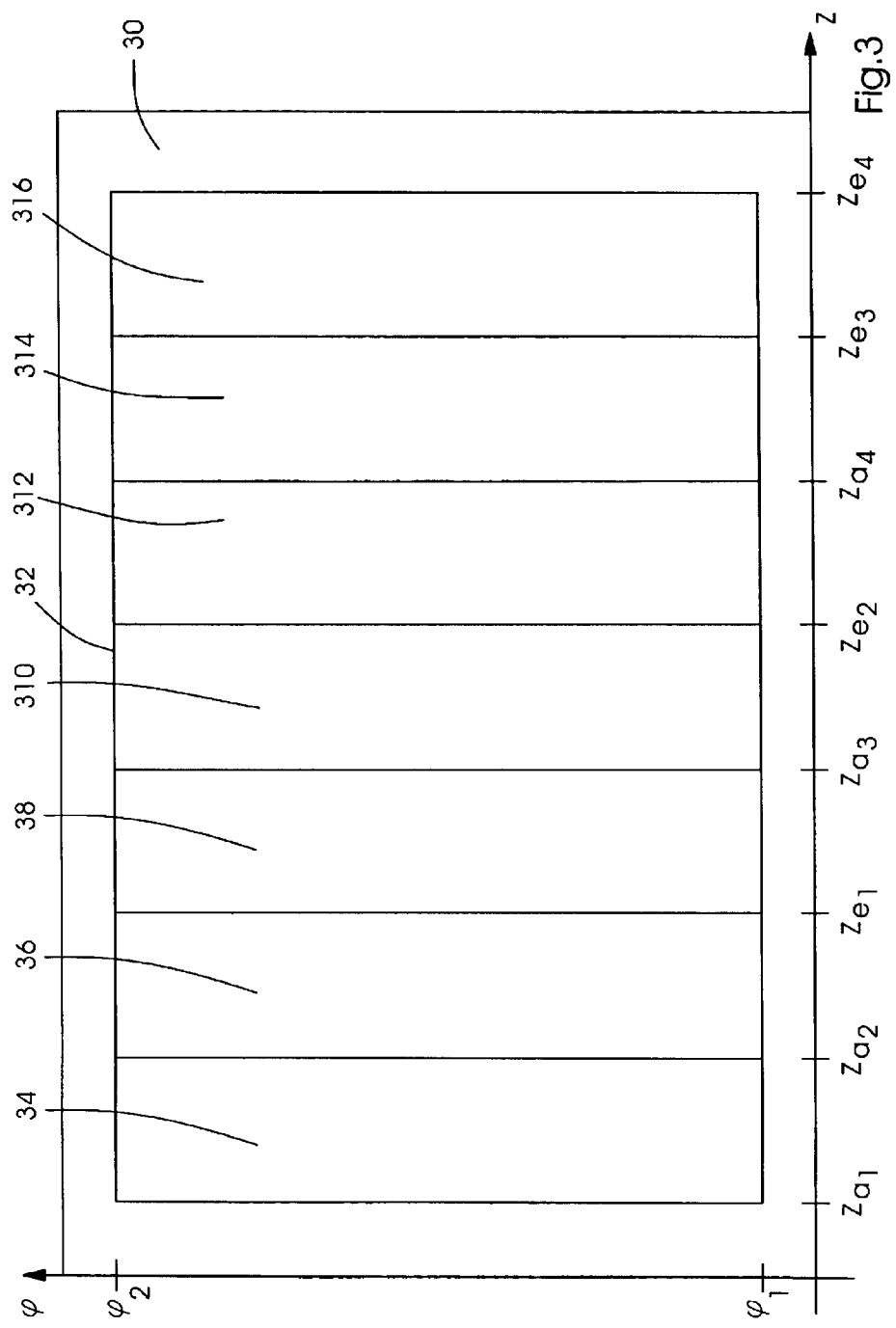
Figure 4:
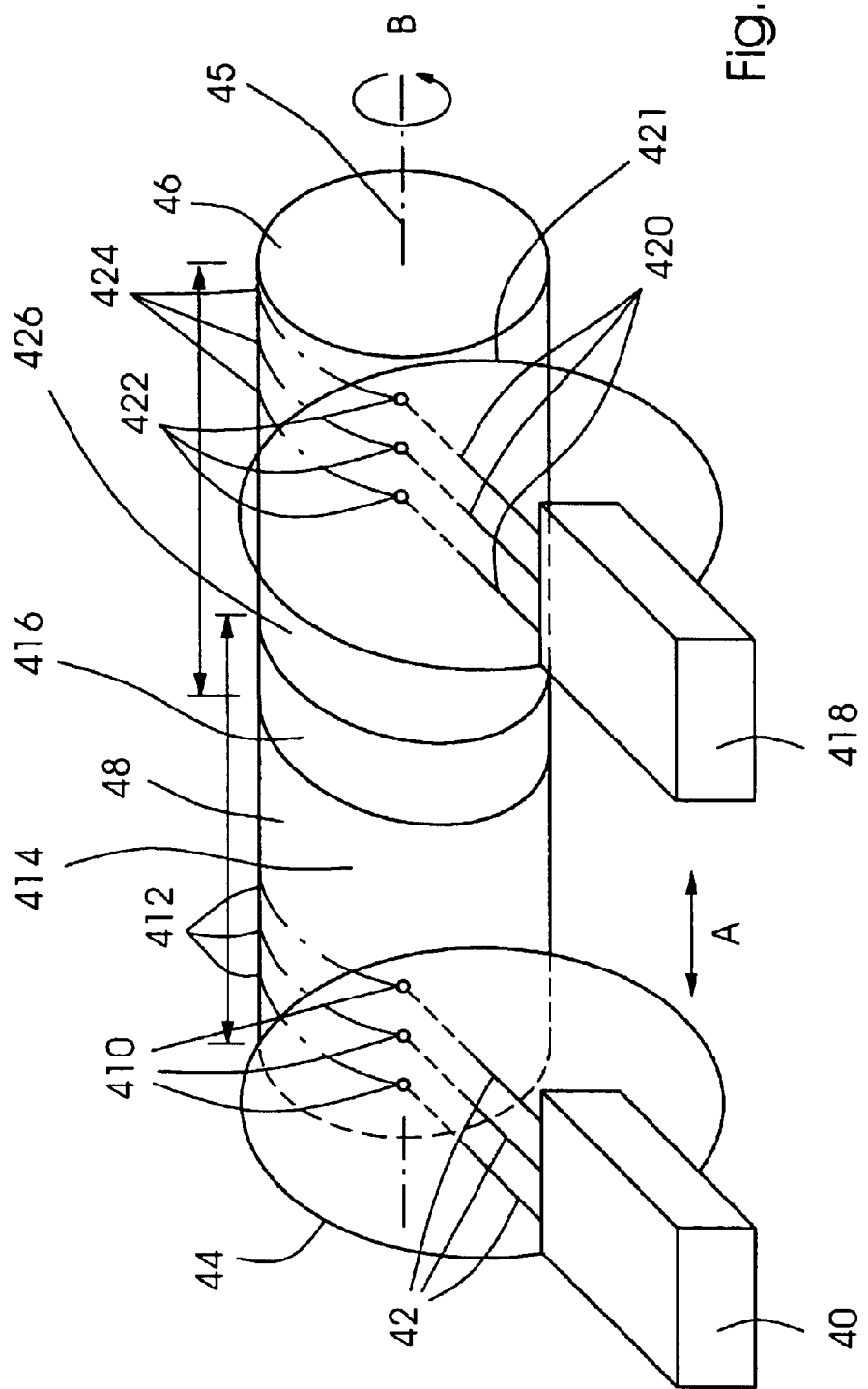
Figure 5:
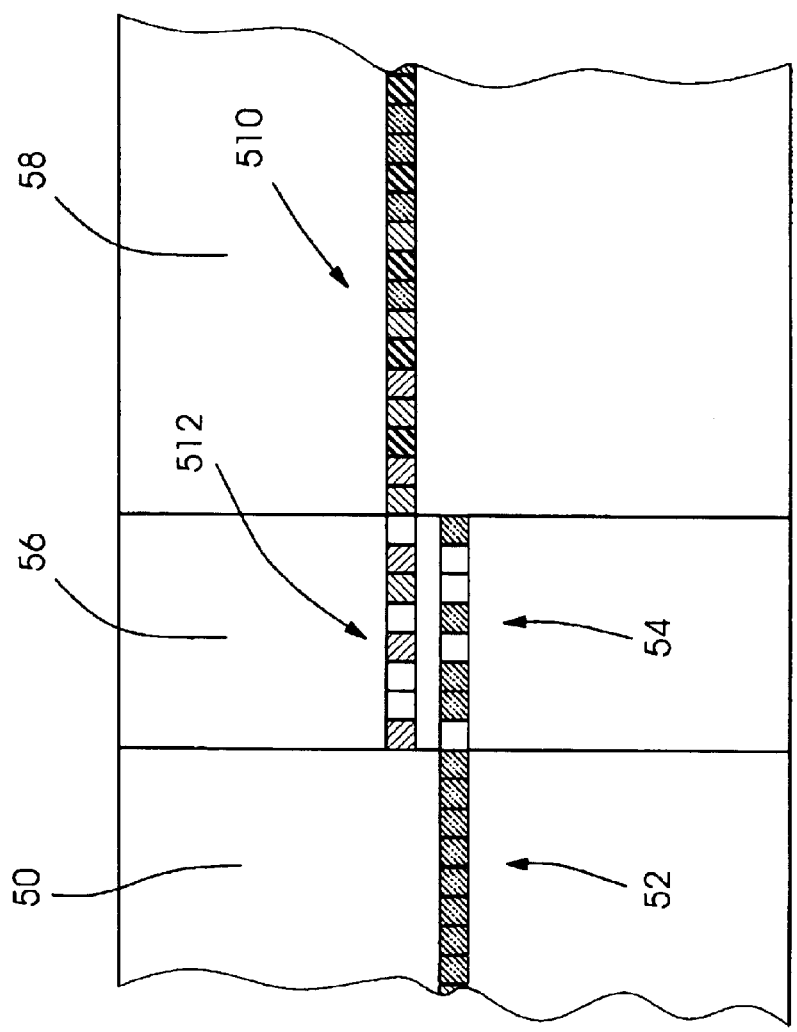

In the following, the present invention will be explained in greater detail with reference to a graphically depicted exemplary embodiment from which further advantages and features of the invention ensue. Specifically shown are in FIG. 1 a schematic view of an arrangement of an imaging module having an array of light sources, illustratively featuring three light beams for imaging a printing form;

FIG. 2 an example of the imaging of a line using the interleaf raster scan line method with an imaging module whose lights sources generate five imaging spots;

FIG. 3 an exemplary division of the total area to be imaged of a printing form for four imaging modules into four assigned regions, including corresponding transition regions;

FIG. 4 a schematic view of the imaging of a printing form having a cylindrical design via two aforementioned imaging modules which image the printing form in the respective assigned regions and in a transition region; and FIG. 5 a schematic view of the reduction of the banding effect according to the present invention.

DETAILED DESCRIPTION

FIG. 1, similar to that of FIG. 1 of U.S. patent application Ser. No. 09/879,609, hereby incorporated by reference herein, shows a typical geometry for projecting n imaging spots originating from an array of n light sources, for example, laser diodes in an imaging module, with n being a natural number. Imaging module 10 is composed, for example, of an individually controllable array of n single strip laser diode as light sources 12, it being especially advantageous for n to be a power of the natural number two, i.e., $n=2^k$ with k being a natural number. An advantageous light source of that kind typically has up to 100 single strip laser diodes, advantageously between 20 and 70 laser diodes. The single strip laser diodes feature emitting surfaces which typically have a size of 1 micrometer×5 micrometer and emit laser radiation of advantageous beam quality having a low beam quality factor $M^2$. The distance of individual laser diodes within the array lies typically between 100 and 1000 micrometers.

Via imaging optics 16, the n light beams are imaged on the n imaging spots 110 on a printing form 18. Expediently, printing form 18 is in the foci of light beams 14. It is especially advantageous that, via imaging optics 16, both the light beams are changed in their diameter ratio (perpendicular and parallel to the axis defined by the n spots) and that the distance of the imaging spots relative to one another is corrected. In other words, both the spot size of the n imaging spots 110 and their position relative to each other as well their spacing are adjustable. As a rule, the spacing between the individual light sources is constant; for an advantageous imaging, however, it is only required that distance l of the n imaging spots 110 be constant. Spacing l of the n imaging spots is larger than spacing p of the printing dots.

It is possible for light sources 12 of imaging module 10 to be used in continuous operation. To generate individual light packets, the laser emission is correspondingly suppressed for a certain time interval. In a special embodiment, however, it is also possible for a light source 12 which emits pulsed radiation to be used in imaging module 10. When working with pulsed radiation, the repetition rate of the light pulses must be at least just as high as the cycle frequency for producing the individual printing dots so that at least one laser pulse is available for one printing dot. Imaging optics 16 can contain both reflective, transmissive, refractive or similar optical components. These are preferably microoptical components. Imaging optics 16 can have both a magnifying and a reducing effect as well as different image scales in the two directions parallel and perpendicular to the active zone of the lasers, which is expedient, in particular, for divergence and aberration correction. The surface of printing form 18 is changed in its physical or chemical properties by the laser radiation. It is expedient to use printing forms which are erasable or rewritable.

In a preferred embodiment, imaging module 10 is situated on a cooling element 112. Imaging module 10 is connected to a control unit 116 via a power supply and control line 114. Control unit 116 features individual components which enable the individual laser diodes of the array of light sources 12 to be driven or controlled separately from each other. Cooling element 112 is connected to temperature control 120 via a cooling element control line 118.

For operational testing and determining the power output of the individual light sources 12, provision is made for a detector 122. In this context, the detector can be designed in such a manner that an individual measuring device is provided for each light source or else, that one measuring device checks the individual light sources alternately or on demand. Detector 122 is advantageously connected to control unit 116 via connection 124 so that the power output is processed in control unit 116 as a parameter for the generation of a control signal.

Prior to describing the IRS method in greater detail with reference to an example in FIG. 2, general explanation are required in this regard. As mentioned earlier, for imaging a printing form, the imaging spots are initially moved over the printing area with a component perpendicular to the direction defined by the line of imaging spots so that the mentioned raster scan lines are formed. A continuous line of printing dots will then be understood as a line resulting from the subsequent displacement in the direction defined by the direction of the printing dots and, therefore, as printing dots lying at the same height of different scan lines written side by side.

The intervals of the n imaging spots which are concurrently produced by the individual n light sources are selected to be constant; length l between two neighboring imaging spots is advantageously an integral multiple m of spacing p of the printing dots, that is l=m×p. A continuous writing during which each raster dot is touched by the imaging spot of a light source at least once, with n concurrently written imaging spots at intervals of l=m×p, with m being a natural number and p denoting the spacing of the printing dots, is always possible when an appropriate displacement is selected. The displacement distance is advantageously equal to the number of printing dots.

In the process, however, it can happen that one dot is written repeatedly. A continuous writing during which each printing dot is written exactly once is possible, in particular when the number of imaging spots n, with the step size being t=n×p, and spacing l of neighboring imaging spots measured in units of spacing p of the printing dots do not have a common divisor. In other words, n and m are relatively prime. This is the case, for instance, if m and n are different prime numbers or powers of different prime numbers. An exemplary situation is therefore that n is a power of the natural number two and m is an odd number. The, at the same time, the displacement defined by the direction given by the line defined through the n imaging spots has to be selected to be n. In this context, a border is formed at the beginning and at the end of the line to be written, the size r or the border being: r=n×m−(n+m−1). In the example show in FIG. 2 therefore: r=3×5−(3+5−1)=8.

Since the individual light sources can be controlled separately, it is possible for each printing dot to be configured individually. The power of a specific laser beam intended for writing a raster dot is determined according to the given image data information. In this manner, an individual blackening of different printing dots can be attained.

An IRS method for writing printing plates which is disclosed in incorporated-by-reference U.S. patent application Ser. No. 09/879,609 is illustrated FIG. 2 on the basis of an example of five imaging spots which are concurrently generated through simultaneous irradiation via five individual laser diodes. In this Figure, printing dots are represented in a simplified manner as squares. As mentioned earlier, each printing dot has to be touched by an imaging spot of a laser at least once so as to be imaged or left unchanged according to the given image data. In this example, a continuous line to be written is composed of printing dots which are arranged side by side without gaps. The spacing thereof is denoted by p.

In FIG. 2, the group of concurrently written printing dots of an imaging module 20 is composed of five imaging spots having a uniform spacing l. In first imaging 22, five unit spots are written which have the spacing l=3p. Subsequently, imaging module 20 is displaced in such a manner that the group of concurrently produced printing dots is shifted in the direction defined by the axis of the printing dots, here for example to the right, by five unit spots because in this example, five printing dots are written at the same time.

In second imaging step 24, again, five imaging spots are placed subsequent to a displacement by translation distance t. Iteratively, a new displacement by five unit spots takes place in the direction defined by the axis of the printing dots by translation distance t, here for example to the right. In subsequent imaging step 26, five spots are placed again. It is obvious from this sequence that the printing plate can be written without gaps: each printing dot represented by a square is touched once by the imaging spot of a laser. In each new imaging subsequent to a displacement step by five units of length as translation distance t measured in units of p to the right, always the same pattern of printing dots which have already been written and which have not yet been written is produced, as is discernible in 28. Therefore, the line of written imaging spots has still certain gaps featuring unwritten raster dots at its right end.

If a further imaging of five raster dots is now carried out at the right end of this representation, then the same sequence of still unwritten and already written raster dots is formed. At the same time, the portion of the completely written printing dots of the line is becomes longer and longer.

Also discernible in iterated imaging step 28 are the starting border having size $r_1$ and the end border having the $r_2$, in this case including eight printing dots, measured in units of spacing p of the printing dots. In this context, it deserves special mention that the set of printing dots placed in the starting region and in the end region, respectively, have a not-simply connected topology. In this example, it is at the same time discernible that the ordered set of printing dots, for example counted from the left to the right, of starting border $r_1$, features a pattern which is complementary to the ordered set of printing dots in end border $r_2$.

Even in the case of a failure of individual light sources in the array, it is possible to use the proposed IRS method for imaging printing forms. The imaging speed is maximal especially when the number of the n imaging spots of the laser beams and the distance l of two neighboring imaging spots l, measured in units of p, are relatively prime. In other words, it is possible to specify a step size so that each dot to be written is touched by an imaging spot of the laser beams only once.

In case of inoperability of one or a plurality of single strip laser diodes within the group of concurrently written imaging spots 30, a writing via the IRS method is still possible. In this connection, always the largest section of the group having equally spaced neighboring imaging spots are used for writing. It is obvious that then, the step size needs to be reduced as well to attain a continuous writing. This is expediently done in accordance with the rules stipulated above with respect to the properties of natural numbers.

The imaging of a printing plate using the IRS method is possible with any combination of distances between the neighboring imaging spots l and the number n thereof. To attain a continuous writing of the printing plate, however, it is required to choose suitable parameters. In case of a failure of an imaging spot, imaging is possible at reduced speed.

For the described IRS method for imaging a printing plate, a plurality of laser beams are required. These can also be generated from laser light sources other than the laser diodes to be advantageously used. In an advantageous refinement, it is possible for the printing plate to be tilted by an angle which is unequal to zero relative to the plane lying perpendicular to the n light beams in order to change the projected distance between the individual light sources.

FIG. 3 shows an exemplary division of the total area to be imaged of a printing form for four imaging modules into four assigned regions, including corresponding three transition regions. FIG. 3 shows a printing form 30 with two coordinate axes, coordinate φ and coordinate z. The image-related region 32 of printing form 30 is divided into a plurality of strip-shaped, simply connected regions, with transition regions lying therebetween, respectively. The regions as called strip-shaped because they have an extension from a beginning of the strip at coordinate $φ_1$ to an end of the strip with coordinate $φ_2$. First region 34, which is assigned a first imaging module which is not shown here, extends from a first starting point $za_1$ up to a second starting point $za_2$. First region 34 is imaged by the first imaging modules not shown here. Adjacent thereto is a first transition region 36 extending from second starting point $za_2$ to first end point $ze_1$. Following is a second region 38 which extends form first end point $ze_1$ to third starting point $za_3$. This second region is assigned a second imaging modules not shown here. Second region 38 is imaged by the second imaging module not shown here. First transition region 36 is imaged both by the first imaging module not shown here and by the second imaging module not shown here. In analogous continuation, second region 38 is followed by a second transition region 310 extending from third starting point $za_3$ to second end point $ze_2$. In other words: the first imaging module not shown here can be moved in such a manner that the imaging spots of its light sources can be both in first region 34 and in first transition region 36 so that an imaging can be carried out by translation in the longitudinal direction and in the transverse direction of the strip-shaped, simply connected first region 34 and of the strip-shaped, simply connected first transition region 36. At the same time, the second imaging module not shown here can be moved in such a manner that the imaging spots of its appertaining light sources can be both in first transition region 36 and in second region 38 as well as in second transition region 310. Second transition region 310 is followed by a third region 312 having the boundaries of second end point $ze_2$ and fourth starting point $za_4$. Following is a third transition region 314 having the boundaries of fourth starting point $za_4$ and of third end point $ze_3$. Moreover, a fourth region 316 is discernible which extends from third end point $ze_3$ to fourth end point $ze_4$. Analogously to first region 34, first transition region 36 and second region 38 and the appertaining first and second imaging modules not shown here, provision is made for third and fourth imaging modules which are not shown here. In this context, the imaging spots of the third imaging module not shown here can be in second transition region 310, in third region 312 and in fourth transition region 314 while the imaging spots of the light sources of the fourth imaging module not shown here can be in fourth transition region 314 and in fourth region 316.

FIG. 4 shows the imaging of a printing form located on a rotatable cylinder and, by way of example, how a first imaging module 40 and a second imaging module 418 are used. In this connection, the printing form is divided into a first region 414, a transition region 416 and a second region 426.

First imaging module 40 generates n light beams, here exemplarily three light beams 42, which are imaged onto three imaging spots 410 via first imaging optics 44. Advantageously, the three imaging spots have a uniform spacing and lie on one axis. Printing form 48 is located on a cylinder 46 which is rotatable about its axis of symmetry 45. This rotation is denoted by arrow B. Imaging module 40 can be moved on a linear path parallel to axis of symmetry 45 of cylinder 46, which is indicated by double arrow A. In this connection, imaging module 40 can be moved in such a manner that the assigned imaging spots 410 lie in first region 414 and/or in intermediate region 416.

Second imaging module 418 generates n light beams, here exemplarily three light beams 420, which are imaged onto three imaging spots 422 via second imaging optics 421. The three imaging spots 422 advantageously have a uniform spacing, preferably the same as imaging spots 410 of first imaging module 40, and lie on one axis. Second imaging module 418 can be moved on a linear path parallel to axis of symmetry 45 of cylinder 46, which is indicated by double arrow A. In this connection, second imaging module 418 can be moved in such a manner that the assigned imaging spots 422 lie in second region 426 and/or in intermediate region 416.

For continuous imaging, cylinder 46 rotates together with printing form 48 according to rotary motion B, and first imaging module 40 and second imaging module 418 translate alongside of cylinder 46 according to moving direction A. The feed rate is determined by the number of light beams 42 or light beams 420 and width p of a printing dot. An imaging ensues which runs around axis of symmetry 45 of cylinder 46 on a helical path. The path of first imaging spots 410 is indicated by lines 412 and the path of second imaging spots 422 is indicated by lines 424. After the imaging of n dots is completed, thus, a relative displacement of printing form 48 and imaging spots 410 and imaging spots 422, respectively, is carried out with a vector component perpendicular to the direction defined by the line of the n imaging spots 410 and imaging spots 422, respectively, by a first specific amount so that n dots are written again at a different location of printing plate 48. In this manner, so-called "raster scan lines" of imaging spots are formed. For each specific distance of neighboring raster scan lines and number n of imaging spots, a second specific amount of a required displacement parallel to the axis defined by the line of the n imaging spots ensues so that a continuous imaging is made possible, i.e., the imaging of every intended raster dot on printing form 48 using an interleaf raster scan line method (the "IRS method") which will still be described in greater detail hereinafter.

In an alternative embodiment, it is also possible to move imaging spots 410 over printing form 48 in a meander form by initially carrying out a complete imaging along a line parallel to axis of symmetry 45 of cylinder 46 and subsequently carrying out a stepwise rotation about this axis of symmetry 45.

It goes without saying that it all depends only a relative movement between imaging spots 410 and printing plate 48. This relative movement can also be attained by a movement of printing cylinder 46. For both moving directions of translation A and of rotation B it applies that the movements can take place continuously or stepwise.

Moreover, at least one imaging module, for example first imaging module 40 featuring light source 42, imaging optics 44 and the like, can alternatively be configured inside printing cylinder 46 as well so that a space-saving arrangement is achieved.

An imaging device of that kind having a plurality of imaging modules can be implemented individually or multiply inside or outside of a printing form imaging unit, a printing unit or a printing machine.

The reduction of the banding effect according to the present invention will now be explained with reference to FIG. 5. FIG. 5 schematically shows a first region 50 in which a printing dot line of the first assigned imaging module 52 lies, a transition region 56 in which end border 54 of the printing dot line of the first imaging module and starting border 512 of the printing dot line of the second imaging module are situated, and a second region 58 in which a printing dot line of second imaging module 510 is located. In FIG. 5, just for better illustration, the printing dot line of first imaging module 52 is drawn at a distance from the printing dot line of second imaging module 510 in a perpendicular direction to the axis of the imaging spots.

In this exemplary case, transition region 56 mentioned earlier extends over eight printing dots in accordance with the exemplary case in FIG. 2, an imaging with five imaging spots at neighboring intervals l=3p and a displacement by translation distance t=5p with p denoting the spacing of the printing dots.

In this context, end border 54 placed by the first imaging module contains a set of not-simply connected placed printing dots, and starting border 512 contains a set of not-simply connected placed printing dots which is complementary to the set of end border 54.

Via the printing dot line of first imaging module 510 in end border region 54, positions are now defined in transition region 56 at which printing dots are still to be placed between the imaged printing dots. Because of deviations, which are frequently related to the adjustment, the second imaging module will generally not place printing dots exactly at these locations, resulting in an offset or deviation. By writing the two lines into one another, i.e., in the present representation, by bringing the two actually meeting lines into alignment, a "continuous" transition region which is not determined by an abrupt change ensues for the eye. The offset is distributed over transition region 56. In addition, no spatial patterns exist which are very easy to be detected by the human eye since the distribution of the dot lines is not easily comprehensible for the human eye, especially if a large number of writing channels is used, for example, fifty concurrently written imaging spots in lieu of the five concurrently written imaging spots described above, and because transition region 56 corresponds to the width of the writing region, for example 1 cm.

Via the method according to the present invention and using a plurality of imaging modules in the device according to the present invention, first of all, a sharp edge between strip-shaped first region 50 and second region 58 is dissolved and an offset or an adjustment deviation between the first and the second imaging modules resulting in a deviation of the position of the printing dots placed by the second imaging module in starting region 521 from the intended position of a printing dot in end region 54 which is not placed yet, is distributed over a larger image area corresponding to transition region 56, and is thus reduced for the eye of an observer. Therefore, the present invention enables the mentioned banding effect to be reduced in a particularly advantageous manner.

In contrast to the related art, when preferably using an interleaf method, this transition region is not attained by an additional imaging and therefore does not result in an extension of the imaging time since the pattern formation of the starting border and the end border is taken advantage of.

Even with imaging modules which densely image the printing dots, compare, for example, U.S. Pat. No. 5,818, 498, it is also possible to reduce the banding effect using this method. To this end, however, the transition regions need to be generated in that not all dots are written by one imaging module. In this case, it is an advantage that a random distribution of the individual imaging spots on the media to be imaged is also possible and that the reduction effect is therefore even intensified.

| List of Reference Symbols | |
|---|---|
| 10 | Imaging module |
| 12 | Light source |
| 14 | Light beam |
| 16 | Imaging optics |
| 18 | Printing form |
| 110 | Imaging spot |
| 112 | Cooling element |
| 114 | Power supply and control line |
| 116 | Control unit |
| 118 | Line to the temperature control |
| 120 | Temperature control |
| 122 | Detector for functional testing and power measurement |
| 124 | Connection to the control unit |
| 20 | Concurrently written printing dots of an imaging module |
| 22 | First imaging |
| 24 | Second imaging |
| 26 | Third imaging |
| 28 | Iterated imaging |
| l | Spacing of neighboring imaging spots |
| p | Spacing of neighboring printing dots |
| n | Number of imaging spots |
| $r_1$ | Starting border |
| $r_2$ | End border |
| t | Translation distance |
| φ | Coordinate in the strip direction |
| z | Coordinate in the interleaving direction |
| $φ_1$ | Beginning of the strip |
| $φ_2$ | End of the strip |
| $za_1$ | First starting point |
| $za_2$ | Second starting point |
| $ze_1$ | First end point |
| $za_3$ | Third starting point |
| $ze_2$ | Second end point |
| $za_4$ | Fourth starting point |
| $ze_3$ | Third end point |
| $ze_4$ | Fourth end point |
| 30 | Printing form |
| 32 | Image-related area |
| 34 | First region |
| 36 | First transition region |
| 38 | Second region |
| 310 | Second transition region |
| 312 | Third region |
| 314 | Third transition region |
| 316 | Fourth region |
| 40 | First imaging module |

-continued

| List of Reference Symbols | |
|---|---|
| 42 | Light beams |
| 44 | First imaging optics |
| 45 | Axis of symmetry |
| 46 | Cylinder |
| 48 | Printing form |
| 410 | Imaging spots of the first imaging module |
| 412 | Path of the first imaging spots |
| 414 | First region |
| 416 | Transition region |
| 418 | Second imaging module |
| 420 | Light beams |
| 421 | Second imaging optics |
| 422 | Imaging spots of the second imaging module |
| 424 | Path of the second imaging spots |
| 426 | Second region |
| A | Translation |
| B | Rotation |
| 50 | First region |
| 52 | Printing dot line of the first imaging module |
| 54 | End border |
| 56 | Transition region |
| 58 | Second region |
| 510 | Printing dot line of the second imaging module |
| 512 | Starting border |

What is claimed is:

1. A method for imaging a printing form via at least one first imaging module and one second imaging module for producing printing dots on the printing form, in connection with which both imaging modules, for the imaging in a transition region, cover identical locations of the printing form, comprising the steps of:

producing in the transition region a plurality of at least partially not-simply connected first printing dots using the first imaging module; and producing in the transition region complementary, not-simply connected second printing dots using the second imaging modules, wherein at least one simply connected first region of printing form is assigned to the first imaging module and a second simply connected region of the printing form is assigned to the second imaging module, the first printing dots being produced in the first region only by the first imaging module and the second printing dots being produced in the second region only by the second imaging module;

the first and second imaging modules each have n light sources, the light sources producing imaging spots on the printing form having a spacing l of neighboring imaging spots, the spacing l being a multiple of a spacing p of two neighboring printing dots.

2. The method as recited in claim 1, wherein the printing form is imaged by each of the first and second imaging module using an interleaf method at least in the transition region.

3. The method as recited in claim 2, wherein the interleaf method has a step size t equal to the number n of the light sources in each of the first and second imaging modules, the step size t and the spacing l of neighboring imaging spots, measured in units of the spacing p of neighboring printing dots, being relatively prime.

4. A device for imaging a printing form comprising:

a first imaging module for guiding first imaging spots of at least one first light source over a transition region of the printing form, the first imaging spots of the at least one first light source producing a first set of printing dots in the transition region constituting a not-simply connected set; and a second imaging module for guiding second imaging spots of the at least one first light source or at least one second light source over the transition region of the printing form, the second imaging spots producing a complementary, not-simply connected second set of printing dots in the transition region;

the first and second imaging modules being movable relative to the printing form;

wherein each of the first and second imaging modules has n light sources lying on one line at a distance l between neighboring light sources.

5. A printing form imaging unit comprising at least one device for imaging a printing form as recited in claim 4.

6. A printing unit comprising at least one device form imaging a printing form as recited in claim 4.

7. A printing machine comprising at least one printing unit as recited in claim 6.

* * * * *